US012755066B2

(12) United States Patent
Baker

(10) Patent No.: US 12,755,066 B2
(45) Date of Patent: Oct. 6, 2026

(54) METHODS AND SYSTEMS FOR ANALYZING AND PREDICTING AEROELASTIC FLUTTER ON CONFIGURABLE AIRCRAFT

(71) Applicant: Government of the United States, as represented by the Secretary of the Air Force, Wright-Patterson AFB, OH (US)

(72) Inventor: Brandon Baker, Kaysville, UT (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 1247 days.

(21) Appl. No.: 17/555,850

(22) Filed: Dec. 20, 2021

(65) Prior Publication Data

US 2022/0300672 A1 Sep. 22, 2022

Related U.S. Application Data

(60) Provisional application No. 63/163,074, filed on Mar. 19, 2021.

(51) Int. Cl.
*G06F 30/15* (2020.01)
*B64F 5/60* (2017.01)
*G06F 30/27* (2020.01)

(52) U.S. Cl.
CPC ................ *G06F 30/15* (2020.01); *B64F 5/60* (2017.01); *G06F 30/27* (2020.01)

(58) Field of Classification Search
CPC ............. G06F 30/15; G06F 30/27; B64F 5/60
See application file for complete search history.

(56) References Cited

U.S. PATENT DOCUMENTS 6,185,470 B1 * 2/2001 Pado .................... G05B 13/027 706/23
6,216,063 B1 * 4/2001 Lind ......................... B64F 5/60 701/4

(Continued)

FOREIGN PATENT DOCUMENTS

CN 104182560 B 12/2014
CN 109063290 A 12/2018

(Continued)

OTHER PUBLICATIONS

EP 3109157 A1 (Year: 2016).*
Denegri et al, Limit Cycle Oscillations using ANN (Year: 2001).*

*Primary Examiner* — Ryan F Pitaro
*Assistant Examiner* — Adrian Stoica
(74) *Attorney, Agent, or Firm* — AFMCLO/JAZ; Jeffrey V. Bamber

(57) ABSTRACT

Methods and systems for analyzing and predicting aeroelastic flutter on configurable aircraft are disclosed herein. The method may include the steps of: a) flying a known aircraft type above ground, wherein the aircraft has a payload in a known configuration; b) acquiring data from at least one sensor on the aircraft while flying above ground; c) repeating steps a) and b) with a different payload configuration; d) training a machine learning predictive model for the aircraft type for aeroelastic flutter using the collected data; and e) using the predictive model to predict when aeroelastic flutter may occur on the aircraft type when the aircraft has a payload in a new configuration for which data from sensors was not previously collected with the aircraft in flight.

16 Claims, 2 Drawing Sheets

(56) References Cited

U.S. PATENT DOCUMENTS

| | | | | |
|---|---|---|---|---|
| 6,375,127 | B1 | 4/2002 | Appa | |
| 7,617,166 | B2 * | 11/2009 | Haudrich | G06N 3/10 706/22 |
| 8,060,350 | B2 | 11/2011 | Silva | |
| 9,073,623 | B1 | 7/2015 | Suh | |
| 9,804,054 | B2 | 10/2017 | Vinod et al. | |
| 10,337,414 | B2 | 7/2019 | Murugesan et al. | |
| 10,634,580 | B2 | 4/2020 | Goodman | |
| 2013/0158891 | A1 * | 6/2013 | Niepokolczycki | G06F 17/142 702/33 |
| 2016/0355278 | A1 * | 12/2016 | Goodman | G01M 5/0016 |
| 2018/0322958 | A1 * | 11/2018 | Kalafatis | G16H 50/70 |
| 2020/0202723 | A1 * | 6/2020 | Pierre | G06N 3/045 |

FOREIGN PATENT DOCUMENTS

| | | | | |
|---|---|---|---|---|
| CN | 109086501 | A | 12/2018 | |
| CN | 109446557 | A | 3/2019 | |
| EP | 3109157 | A1 * | 12/2016 | B64D 7/00 |

* cited by examiner

METHODS AND SYSTEMS FOR ANALYZING AND PREDICTING AEROELASTIC FLUTTER ON CONFIGURABLE AIRCRAFT

Pursuant to 37 C.F.R. § 1.78(a)(4), this application claims the benefit of and priority to prior filed Provisional Application Ser. No. 63/163,074 filed Mar. 19, 2021, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to methods and systems for analyzing and predicting aeroelastic flutter on aircraft and, more particularly, to methods and systems for analyzing and predicting aeroelastic flutter on configurable aircraft that are able to warn a stakeholder of the conditions that may cause aeroelastic flutter.

BACKGROUND OF THE INVENTION

Many types of engineered structures, such as skyscrapers, bridges, and aircraft airframes, are subject to vibrational stresses which can be caused by aerodynamic forces due to wind, for example, or due to the airspeed of an aircraft in flight. The aerodynamic forces over such structures may cause an unstable oscillatory aeroelastic deformation, or vibration, of the structure referred to as flutter. Flutter may involve different types of motion, or stress, such as bending or twisting, combinations of which may be referred to as a mode (e.g., mode of deformation) or vibrational mode.

Aircraft, particularly military aircraft can be configured in many different manners due to weapons/ordnances, loads, guidance systems, and tracking systems. This can change the configurations of the profile of the wings and/or the body of the aircraft. The different configurations can each have their own set of conditions under which flutter may develop.

Prior attempts to predict whether aircraft will develop aeroelastic flutter are described in the patent literature. Some patent publications describe the use of wind tunnels to attempt to determine the wind speeds at which flutter initially occurs. However, it is very impractical to conduct such testing for different aircraft, each having many possible configurations. In addition, the initiation of flutter in an aircraft's wings may cause damage to the wings.

Other attempts to predict whether aircraft will develop aeroelastic flutter when in flight have often involved the use of finite element analysis. It has been found that finite element analysis produces results that are not always sufficiently accurate.

The need for improved methods and systems of more accurately predicting when an aircraft will develop aeroelastic flutter has continued. In particular a need exists for methods and systems of more accurately predicting when an aircraft will develop aeroelastic flutter that are capable of utilizing actual flight data from the aircraft, and for receiving as input all relevant data from the aircraft that might play a part in predicting when an aircraft will develop aeroelastic flutter.

SUMMARY OF THE INVENTION

While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a method for analyzing and predicting aeroelastic flutter on an aircraft is provided. The method comprises:

a) flying a known aircraft type above ground, wherein the aircraft has a payload in a known configuration;
b) acquiring data from at least one sensor on the aircraft while flying above ground;
c) repeating steps a) and b) with a different payload configuration;
d) training a machine learning predictive model for the aircraft type for aeroelastic flutter using the acquired data;
e) using the predictive model to predict when aeroelastic flutter may occur on the aircraft type when the aircraft has a payload in a new configuration for which data from sensors was not previously collected with the aircraft in flight.

As further described in the Detailed Description, if any of the steps (such as steps (a) to (c) have previously been completed such that data exists for the same, then the method may start with step (d) above.

According to another embodiment of the present invention, a system for predicting and warning of the potential for aeroelastic flutter on an aircraft is provided. The system comprises:

a processing unit located in an aircraft, wherein the processing unit has a predictive model code loaded thereon for predicting the onset of aeroelastic flutter, wherein the processing unit is in communication with at least one sensor on the aircraft and is configured to receive data from at least one sensor on the aircraft; and a warning mechanism in communication with the processing unit that provides a pilot with an indication of an impending flutter condition.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The present invention relates generally to methods and systems for analyzing and predicting aeroelastic flutter on aircraft and, more particularly, to methods and systems for analyzing and predicting aeroelastic flutter on configurable aircraft that are able to warn a stakeholder of the conditions that may cause aeroelastic flutter.

The term "aircraft" refers to a machine that can fly. For the purposes of the present invention, the term aircraft refers to a flying machine that may experience aeroelastic flutter. There are perhaps thousands of aircraft types, which may include but are not limited to: BAC (Jet Provost, Strikemaster, TSR-2), Boeing YB-9, General Dynamics F-16 Fighting Falcon, Lockheed Martin F22 Raptor, Lockheed Martin F-35 Lightning II, Lockheed XFV, McDonnell Douglas F-15 E Strike Eagle, and Northrop F-5, to name a few.

To distinguish the many airplanes produced of the same type, a tail number may be assigned. For example, General Dynamics may have produced roughly 4,500 F-16 Fighting Falcons, so there may be 4,500 unique tail numbers for that type of aircraft.

The term "stakeholder", as used herein, refers to a person interested in analyzing, predicting, preventing, and/or being warned of aeroelastic flutter on an aircraft. This may include, but is not limited to: pilots, scientists, engineers, and researchers. The stakeholder may be at various locations including, but not limited to: in the aircraft during flight, or on the ground in an office or laboratory with computing equipment, or in a flight simulation environment.

Figure 2:
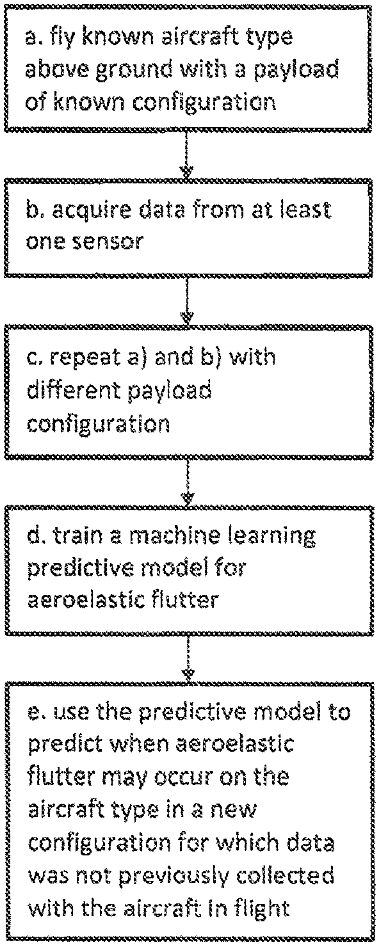
FIG. 2 is a flow diagram showing one embodiment of the method.

In one embodiment of the present invention, a method for analyzing and predicting aeroelastic flutter on an aircraft is provided. The method comprises several steps. One version of the method is shown in the flow chart in FIG. 2.

First Step—Flying the Aircraft

A first step may comprise flying a known aircraft type above the ground, wherein the aircraft has a payload in a known configuration. The aircraft can comprise any suitable type of aircraft that is potentially subject to aeroelastic flutter. The aircraft can be a military aircraft or a civilian aircraft. Typically, the aircraft will be a fixed wing military aircraft since such aircraft may carry payloads in different configurations, and may be operated at higher speeds, although home-built aircraft have been known to flutter at speeds as low as 55 mph.

Figure 1:
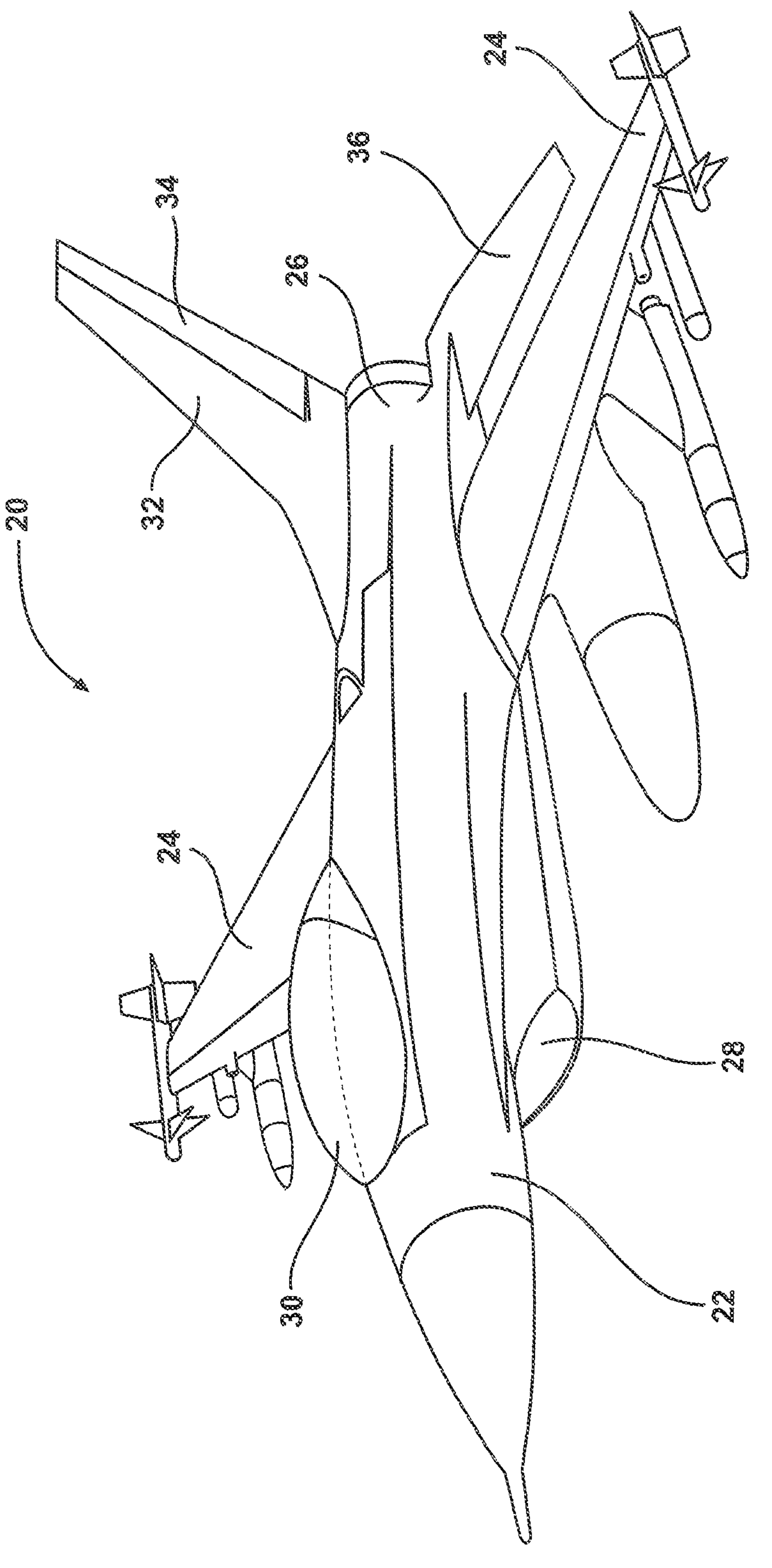
FIG. 1 is a perspective view of a military aircraft.

FIG. 1 shows one non-limiting embodiment of a configurable military fighter aircraft 20. The fighter aircraft 20 comprises a fuselage 22, a pair of wings 24, an engine 26, an air intake 28, a cockpit having a bubble canopy 30, a vertical stabilizer 32 having a rudder 34, and a pair of horizontal stabilizers 36. The wings 24 have an upper surface and an underside. One example of such a fighter aircraft may have 11 locations for mounting weapons and other mission equipment.

The payload (or load) can comprise various combinations of items attached to the aircraft externally or internally that may include, without limitation, nuclear missiles, air-launched cruise missiles, rotary launchers, cruise missiles, anti-ship missiles, heat-seeking air-to-air missiles (AAM), radar guided medium-range AAM, air-to-ground missiles, rockets, guided bombs, glide bombs, radios, internal rotary launchers, internal smart bombs, hypersonic missiles, electronic countermeasures (ECM), navigation units, targeting or weapons pods, fuel tanks, sensor or radar pods, or a cannon. Alternate forms of payload may be known to those skilled in the art. Each item of payload may be characterized by physical properties including, without limitation, weight (kg), moment of inertia, drag coefficient, torque applied at location of payload attachment, length, height, or width. The payload may be joined to any suitable portion of the aircraft. For example, the payload may be joined to and project from the underside of the wings of the aircraft (rack mounts). For a given military fighter aircraft there may be dozens of positions to attach or join a load, and there are many different types of loads that may be attached. This may be result in a large number of permutations of possible loads and locations of attachment of the same. It would be impractical to attempt to test every possible permutation for when each permutation might develop aeroelastic flutter.

The terms "attached" and "joined", as used herein, encompass configurations in which an element is directly secured to another element by affixing the element directly to the other element; configurations in which the element is indirectly secured to the other element by affixing the element to intermediate member(s) which in turn are affixed to the other element; and configurations in which one element is integral with another element, i.e., one element is essentially part of the other element. The terms "attached" and "joined" includes both those configurations in which an element is temporarily joined to another element, or in which an element is permanently joined to another element.

When it is said that the first step may comprise flying a known aircraft type above the ground, it is understood that this step may not need to be performed anew when a particular aircraft with a payload in a known configuration has already been flown, and data described herein already exists for that aircraft with that particular payload configuration. In addition, the step of obtaining data from flying the aircraft above the ground is intended to be distinguishable from data generated from testing the aircraft in a wind tunnel since the latter data may be inherently less reliable than in-use conditions.

Second Step—Collecting Data

A second step may comprise acquiring data from at least one sensor on the aircraft while the aircraft is flying above ground. The term "acquiring", as used herein with respect to data, may be used to describe collecting and/or recording data. The aircraft may have a plurality of sensors. These may include, but are not limited to: altimeters, air speed sensors, piezoelectric sensors, a GPS sensor or recorder, and sensors that measure or observe weather conditions (e.g., cloudy, atmospheric/barometric pressure, air temperature, and air pressure). In certain embodiments, it may be desirable to record/collect at least the air speed of the aircraft. All other data may be optional. In other embodiments, it may also be desirable to collect/record data on the flight of the aircraft. These may include, but are not limited to: roll rate, pitch rate, and yaw rate (all in degrees), and the G-force. The data will typically be recorded/collected continuously at periodic intervals during each flight of the aircraft. The different types of data may be collected at different time intervals. For instance, some data may be collected every ten seconds, and other data may be collected every ten milliseconds.

When it is said that the second step may comprise acquiring data from at least one sensor on the aircraft while the aircraft is flying above ground, it is understood that this step may not need to be performed anew when a particular aircraft with a payload in a known configuration has already been flown, and data described herein already exists for that aircraft with that particular payload configuration.

Third Step—Repeating First and Second Steps

A third step may comprise repeating a) the first step and b) the second step with a different payload configuration for the particular aircraft. One exemplary embodiment of this step may comprise flying an aircraft with a different payload configuration that may be a different airplane (with a different tail number) but of the same aircraft type as described in the paragraph above that defines the term "aircraft".

The different payload configurations may include, but are not limited to: providing the aircraft with different payloads (e.g., different types of weapons/ordnance, or other types of payloads); and joining the payload(s) to different locations on the aircraft.

The third step may comprise repeating a) the first step and b) the second step with a plurality of N different payloads with M different possible locations on the aircraft for at least a plurality of N+M unique test flights.

(If a mathematical function could be derived to describe the flutter properties of different payload configurations, it would be a non-linear, multi-variate function with N+M unknowns. Theoretically, one would only need N+M unique equations to solve the non-linear system. For example: 10 different payload types to be placed on a total of 10 different locations would give 20 total unknowns; yet the number of configurations (or permutations) for 10 payloads at 10 locations is 10 to the $10^{TH}$ power. N+M is the theoretical lower-bound for the required number of equations to successfully derive a sufficiently simple mathematical multivariate equation. In practice, many more than the theoretical lower-bound are employed to gain sufficient information to overcome instrumentation noise, trivial cases, higher-order non-linear terms, and factors that may distort the results.)

In some cases, the third step may comprise repeating steps a) and b) with at least five different payload types in at least five different locations on the aircraft all the way up to repeating steps a) and b) with hundreds of different payload types on a dozen or more different locations on the aircraft. In some cases, the third step may comprise repeating steps a) and b) with a plurality of different payloads wherein at least one location on the aircraft is provided with a plurality of different payloads (that is, one type of payload is positioned at the specified location for each flight, but the payload is changed to a different payload on each subsequent flight). For example, the third step may comprise repeating steps a) and b) with at least five different payloads on a single location on the aircraft.

When it is said that the third step may comprise repeating a) the first step and b) the second step with a different payload configuration, it is understood that this step may not need to be performed anew when a particular aircraft has already been flown with different payload configurations, and the data described herein already exists for that aircraft with those particular payload configurations. For example, data may be collected and archived in a data storage device or apparatus (such as a computer hard drive or server) to be utilized to train a predictive model at a later time. If such data is already available, then the method can start with step 4 below. In such a case, step 4 will be the first step.

Fourth Step—Training a Machine Learning Model

The fourth step comprises training a machine learning predictive model (or simply the "machine learning model") for the aircraft type for aeroelastic flutter using the data described in the previous steps.

It may be desirable to carry out several additional preliminary steps prior to the fourth step. These include, but are not limited to: organizing the data; selecting a machine learning predictive model; and splitting the data into a first group for training a machine learning model and a second group for validating the machine learning model.

Organizing the Data.

The preliminary step of organizing the data may include, but is not limited to organizing the data using at least one of the following techniques: scaling the data to a common range for all data types; categorically encoding non-numerical values; and filtering data to improve data integrity.

Scaling the data refers to a process in which data collected in different units, for example, is placed into common units. For instance, in some cases longitude and latitude data may be collected in feet, meters, and degrees. Scaling involves converting all such data to common units or a common scale. Scaling may also include normalization by dividing each value from a particular sensor or other data source by the standard deviation of all the data points of that sensor or source. This practice can align values from each distinct data source with values of other data sources, so one source is not weighted more heavily than another.

Categorically encoding uses practices known to those skilled in the art of machine learning which may comprise selecting a "Categorical" input type that may affect the aeroelastic flutter properties of the aircraft. Categorical data may be identified in society with a number so that humans can identify them easily (such as a numerical index), but the quantifiable value of number itself means nothing. An example of such encoding may be a "tail number" which is effectively a serial number for a particular aircraft. Flight plans, post flight briefings, test reports, or other documentation may indicate a tail number by numbered indices (1, 2, 3 . . . 10, for example) but the quantity "1" or "1.0000" means nothing in a mathematical sense in this case. Likewise, tail number 10 has nothing to do with the actual numerical value "10," especially in relation to the other nine indices. It just happens to arbitrarily be assigned the number ten which was an otherwise unused numerical index. Thus, each possible option for that category is expanded as a separate input variable, and then a Boolean value may be used (a 1 or a zero to indicate which category a particular tail number was flown for that particular data). When tail number six is flown, all collected data will have zeros for categories "Tail Number 1," "Tail Number 2," "Tail Number 3," {4, 5, 7, 8, 9, and 10} and a "1" for category "Tail Number 6."

Categorical encoding may also include using non-Boolean values for convoluted input data such as payload type and payload location. For example, if payload location were considered a categorical input, one may create input categories for each physical or measurable quantity for each payload location. In other words, there may be categories such as "Payload Location 1 Weight," "Payload Location 2 Weight," "Payload Location 3 Weight," (and so forth) as well as "Payload Location 1 Air Drag Coefficient," "Payload Location 2 Air Drag Coefficient," "Payload Location 3 Air Drag Coefficient," (and so forth), as well as any other desired quantity that can be associated with payload locations. The entries in each of these categories may not be Boolean, but will be meaningful numerical quantities.

Filtering the data may comprise: identifying and/or removing outliers; filling data where a datum is missing or is an outlier; and eliminating all data for a particular flight if the data contain a missing datum. Identifying and removing outliers may comprise filtering out "noise" or outliers in the data, if a particular measurement is sensitive to noise. For example, if a GPS sensor is known to have limited resolution and it incorrectly indicates that an aircraft has not moved, when the aircraft is known to have traveled ten miles, then this data will be filtered out. Similarly, if another sensor has spurious spikes that are not physically possible or even realistic, then these spikes are filtered out as well. Filtering may take place prior to scaling so that the scaled values are not distorted by outliers or missing values.

Selecting a Machine Learning Predictive Model.

The preliminary step of selecting a machine learning predictive model comprises selecting the machine learning predictive algorithm from a number of different types of algorithms. Various types of algorithms include, but are not limited to: Linear Regression, Logistic Regression, Naïve Bayes, Linear Support Vector Machines (SVM), K-Nearest Neighbor, Decision Tree, Kernel SVM, Gradient Boost Trees, Random Forests, Stochastic Gradient, Neural Networks, Convolutional Networks, and other types of algorithms described herein.

The process of selection of an effective machine learning algorithm depends on several factors. Some selection criteria may include, without limitation: size of training data (number of observations) compared to the number of features; interpretability; model accuracy; training time or available computing resources; linearity (or complexity) of input data; cleanliness of input data; and output data type.

If the number of observations is small compared to the number of features, one may select Linear Regression, Naïve Bayes, or Linear Support Vector Machines (SVM). As a minimum, 10 observations per variable is required for using any of these methods. Such solutions may lack robustness when facing the challenge of predicting outcomes for 10 to the $10^{th}$ power permutations, and thus may be less suitable. Conversely, if the number of observations is large compared to the number of features, a K-Nearest Neighbor, Decision Tree, or Kernel SVM algorithm may be suitable. K-Nearest Neighbor method may not respond well to non-linearities in the system and Decision Trees have been known to be unstable at times, so in such cases, Kernel SVMs can be selected.

If one desires to understand intimately how each input value affects the outcome (i.e. "interpretability"), a Linear Regression ("restrictive") algorithm may be selected. If understanding the relationship between inputs and outputs is not as important as accuracy (for an exploratory exercise, for example), a less restrictive algorithm may be selected. Such techniques, however, may not exhibit the accuracy desired to accurately predict flutter, and thus, may be less suitable for determining whether flutter is likely to occur.

If time to completion (needed in a few minutes) or computing resources are limited, such as 200G Floating Point Operations (FLOPS) or fewer, Naïve Bayes or Linear and Logistic Regression algorithms work well. If time to completion is not as important, or sufficient computing resources are available, a more accurate prediction may be realized using SVMs, Neural Networks, or Random Forests. Accuracy is most likely a more important outcome than time to completion, so SVMs, Neural Networks, or Random Forests may be more useful than simpler methods.

Complex data sets tend to require more complex algorithms such as Kernel SVM, Random Forest, and Neural Networks. Complexity of an input data set may be estimated by fitting the data (inputs to outputs) using a linear regression, logistic regression, or linear SVM and check the residual ("error"). If the residual is too high, the data may be complex enough to merit a more complex algorithm.

If the observations have outliers (the data are not particularly "clean") Random Forests may be the best suited algorithm. If the output data comprise selecting between two binary classifications (like determining if a particular email is spam or not spam), Logistic Regression or SVMs may be selected. In the case of aeroelastic flutter, Logistic Regression or SVM may be useful to simply determine if flutter is likely to occur, or not (a Boolean outcome). In some cases, it may be desirable to clean the data well prior to employing the predictive model training exercise, in which case Random Forests may not be as suitable as other algorithms.

If data are highly complex but a high number of observations (10,000 or more) are available, Deep-Learning (Neural Network with multi-layer perceptrons) may be selected. Gradient Boost Trees can be beneficial if observation data contain many missing values or has a high number of irrelevant observation data input types. In some cases, certain types of the algorithms described herein may be excluded.

Splitting the Data Into Two Groups.

The preliminary step of splitting the data into two groups comprises splitting the data into a first group for training a machine learning model and a second group for validating the machine learning model.

The quantity of data that is split into each group can involve placing between about 60% to 90% of the data into the first group for training the machine learning model and the remainder of the data into the second group for validating the machine learning model. A comprehensive splitting technique such as K-Fold Cross-Validation may be used for splitting. K-Fold splits the data into K folds, then trains the data on K−1 folds and tests on the one fold that was left out. It does this for all combinations and averages the result of each instance.

Training and Validating the Machine Learning Model

The data used for training the machine learning predictive model for a particular aircraft and the output of the training can take the form of at least two different embodiments. In one case, the data used for training the machine learning predictive model for a particular aircraft uses payload configuration data to predict the airspeed at which a flutter event will occur. (In other words, the payload configuration is the only input, and the speed at which a flutter event is likely to occur is the only output.) In another case, the data used for training the machine learning predictive model for a particular aircraft uses payload configuration data and airspeed to predict the Boolean value of whether or not a flutter event will occur. (In other words, the configuration and airspeed are the inputs, and "Yes" or "No" indications that a flutter event will likely occur are the output.)

When using K-Fold Cross Validation, the statistical average of all the different combinations of training exercises is the result, which tends to optimize the balance of splitting the training and validation sets. With K-Fold, all observations are used for both training and validation, and each observation is used once for validation. Using K=10 provides a nice balance between computational complexity and validation accuracy.

The end result of the Training and Validation exercise is a mathematical function that accepts the same list of input values as those used in training—only the outcome is unknown.

Fifth Step—Using the Model to Predict Flutter

The fifth step comprises using the predictive model to predict when aeroelastic flutter may occur on the aircraft type when the aircraft has a payload in a new configuration for which data from sensors was not previously collected with the aircraft in flight. When one desires to predict a flutter event, one inputs data into the mathematical predictive model using a computer hardware or software combination. The mathematical model then computes an estimate for the desired prediction value (lowest speed at which a flutter event is likely to occur, or a Boolean flutter event detection).

The method of the present invention may be provided in the form of a system. It should be understood that several of the steps of the methods described herein will be computer-implemented. Such steps may include, but are not limited to: acquiring data; training the machine learning predictive model; and using the predictive model to predict when aeroelastic flutter may occur. Applying the predictive model to predict a flutter event may occur in an office or laboratory with computing equipment, a flight simulation environment, or actually in-flight with real-time sensors feeding the predictive model.

The present invention may also provide a system for warning a pilot of the conditions that cause aeroelastic flutter. Most of the computer power exercised in machine learning is in building the predictive model. Once the predictive model has been built, the model may be employed on an aircraft and used in flight. Running the predictive model requires relatively few computing resources. Aircraft sensor data captured in real-time in flight may be transmitted to a processing unit with the predictive model code loaded on it. The sensor data are fed into the predictive model code as inputs and the output is the model's prediction, whether a Boolean "warning" or a speed at which flutter is predicted to occur. In a particular embodiment, a warning light, voice, icon on a screen, numerical values indicating the predicted speed at which flutter is likely to occur, or other method may provide a pilot an indication of an impending flutter condition. If the aircraft's speed, for example, is approaching the flutter speed for a particular aircraft type, the pilot may be warned to reduce the aircraft's speed.

The aeroelastic analysis methods and systems described herein can provide a number of advantages. The methods have the ability to determine when flutter may occur on a virtually unlimited number of payload configurations, even if they have not been tested in flight. The methods are more accurate than prior attempts since they use actual flight data rather than conventional finite element analysis or wind tunnel data. The methods are also more practical than attempting to conduct wind tunnel tests on each payload configuration. It should be understood, however, that these advantages need not be required unless they are set forth in the appended claims.

It should be understood that every maximum numerical limitation given throughout this specification includes every lower numerical limitation, as if such lower numerical limitations were expressly written herein. Every minimum numerical limitation given throughout this specification includes every higher numerical limitation, as if such higher numerical limitations were expressly written herein. Every numerical range given throughout this specification includes every narrower numerical range that falls within such broader numerical range, as if such narrower numerical ranges were all expressly written herein.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for analyzing and predicting aeroelastic flutter on aircraft, said method comprising:

a) flying a known aircraft type above ground, wherein said aircraft has a payload in a known configuration;

b) acquiring data from at least one sensor on said aircraft while flying above ground;

c) repeating steps a) and b) with a different payload configuration;

d) providing a computer having a machine learning predictive model loaded thereon and training said machine learning predictive model for said aircraft type for aeroelastic flutter using only acquired sensor data;

e) wherein the machine learning predictive model is configured to predict when aeroelastic flutter will occur on said aircraft type when said aircraft has a payload in a new configuration for which data from sensors was not previously collected with the aircraft in flight;

f) providing an aircraft of said known aircraft type with a processing unit with the predictive model loaded thereon, wherein said processing unit is in said aircraft and said processing unit is in communication with at least one sensor on said aircraft and said processing unit is configured to receive data from said at least one sensor on the aircraft, wherein said aircraft comprises a warning mechanism in communication with said processing unit that provides a pilot in real time with an indication of an impending flutter condition.

2. The method of claim 1 wherein step c) comprises repeating steps a) and b) with a plurality of N different payloads with M different possible locations on the aircraft for at least a plurality of N+M unique test flights.

3. The method of claim 1 wherein step c) comprises repeating steps a) and b) with a plurality of different payloads wherein one type of payload is positioned at a given location on the aircraft for each flight, and the payload is changed to a different type of payload on each subsequent flight for said given location.

4. The method of claim 1 wherein prior to training the predictive model, the data are organized using at least one of the following techniques: scaling the data to a common range for all data types; categorically encoding non-numerical values; and filtering the data to improve data integrity.

5. The method of claim 1 wherein a machine learning predictive algorithm is selected prior to training the predictive model, and said machine learning predictive algorithm comprises one of the following types of algorithms: Linear Regression, Logistic Regression, Naïve Bayes, Linear Support Vector Machines (SVM), K-Nearest Neighbor, Decision Tree, Kernel SVM, Gradient Boost Trees, Random Forests, Stochastic Gradient, Neural Networks, and Convolutional Networks.

6. The method of claim 1 wherein the data are split into a first group for training the machine learning predictive model and a second group for validating the machine learning predictive model.

7. The method of claim 6 wherein the data are split into said groups using the K-Fold Cross-Validation technique.

8. The method of claim 1 wherein the data used for training a machine learning predictive model for a particular aircraft uses payload configuration data to predict the airspeed at which a flutter event will occur.

9. The method of claim 1 wherein the data used for training a machine learning predictive model for a particular aircraft uses payload configuration data and airspeed to predict the Boolean value of whether or not a flutter event will occur.

10. The method of claim 1 wherein a plurality of data are collected and archived in a data storage device or apparatus to be utilized to train a predictive model at a later time.

11. A system for predicting and warning of the potential for aeroelastic flutter on an aircraft, said system comprising:

a computer located in an aircraft, wherein said computer has a machine learning predictive model code loaded thereon for predicting the onset of aeroelastic flutter, wherein said predictive model has been trained using only sensor data acquired from prior flights of aircraft of the same type carrying various different payloads, wherein said computer is in communication with at least one sensor on the aircraft and is configured to receive data from said at least one sensor on the aircraft, wherein the machine learning predictive model is configured to predict when aeroelastic flutter will occur on said aircraft when said aircraft has a payload in a new configuration for which sensor data was not previously collected; and a warning mechanism in communication with said computer that provides a pilot with an indication of an impending flutter condition.

12. The method of claim 1 wherein the payload is selected from the group consisting of: nuclear missiles, air-launched cruise missiles, rotary launchers, cruise missiles, anti-ship missiles, heat-seeking air-to-air missiles (AAM), radar guided medium-range AAM, air-to-ground missiles, rockets, guided bombs, glide bombs, radios, internal rotary launchers, internal smart bombs, hypersonic missiles, electronic countermeasures (ECM), navigation units, targeting or weapons pods, sensor or radar pods, or a cannon.

13. The method of claim 5 wherein said machine learning predictive algorithm is selected from the group consisting of one of the following types of algorithms: Linear Regression, Logistic Regression, Naïve Bayes, Linear Support Vector Machines (SVM), K-Nearest Neighbor, Decision Tree, Kernel SVM, Gradient Boost Trees, Random Forests, Stochastic Gradient, and Convolutional Networks.

14. The method of claim 11 wherein the warning mechanism comprises one or more of the following: a warning light, a voice warning over a speaker, an icon on a screen, or a display of numerical values.

15. The method of claim 1 further comprising a step g) warning a stakeholder of the conditions that are likely to cause aeroelastic flutter on said aircraft.

16. A method for analyzing and predicting aeroelastic flutter on aircraft, said method comprising:

a) training a machine learning predictive model for an aircraft type for aeroelastic flutter using only previously acquired flight data;

b) loading the trained machine learning predictive model onto a processing unit located in an aircraft of said aircraft type;

c) while said aircraft is in flight with a new payload configuration, acquiring, by said processing unit, real-time data from at least one sensor on the aircraft;

d) providing a prediction by the predictive model on the processing unit, in real-time, an impending flutter condition based on the real-time sensor data; and e) in response to predicting an impending flutter condition, activating a warning mechanism in communication with the processing unit to provide the pilot of the aircraft with a warning.

* * * * *